(12) United States Patent
Scott et al.

(10) Patent No.: US 8,604,873 B2
(45) Date of Patent: Dec. 10, 2013

(54) GROUND PARTITIONED POWER AMPLIFIER FOR STABLE OPERATION

(75) Inventors: Baker Scott, San Jose, CA (US); George Maxim, Milpitas, CA (US); Stephen Franck, Felton, CA (US); Chu Hsiung Ho, Milpitas, CA (US)

(73) Assignee: RF Micro Devices (Cayman Islands), Ltd., Greensboro, NC (US)

( * ) Notice: Subject to any disclaimer, the term of this patent is extended or adjusted under 35 U.S.C. 154(b) by 69 days.

(21) Appl. No.: 13/310,611

(22) Filed: Dec. 2, 2011

(65) Prior Publication Data

US 2012/0139639 A1 Jun. 7, 2012

Related U.S. Application Data

(60) Provisional application No. 61/419,858, filed on Dec. 5, 2010.

(51) Int. Cl.
*H03F 1/38* (2006.01)

(52) U.S. Cl.
USPC ................. 330/112; 330/99; 330/104

(58) Field of Classification Search
USPC ............. 330/98, 99, 100, 103, 104, 112
See application file for complete search history.

(56) References Cited

U.S. PATENT DOCUMENTS

| | | |
|---|---|---|
| 2,681,953 A | 6/1954 | Bradburd |
| 2,797,267 A | 6/1957 | Yost, Jr. |
| 3,151,301 A | 9/1964 | Bettin |
| 3,287,653 A | 11/1966 | Goordman |
| 3,441,865 A | 4/1969 | Siwko |
| 3,524,142 A | 8/1970 | Valdettaro |
| 3,959,603 A | 5/1976 | Nilssen et al. |
| 4,032,973 A | 6/1977 | Haynes |
| 4,087,761 A | 5/1978 | Fukumoto et al. |
| 4,232,270 A | 11/1980 | Marmet et al. |
| 4,511,857 A | 4/1985 | Gunderson |
| 4,772,858 A | 9/1988 | Tsukii et al. |
| 4,791,421 A | 12/1988 | Morse et al. |
| 4,977,366 A | 12/1990 | Powell |
| 5,023,566 A | 6/1991 | El-Hamamsy et al. |
| 5,412,344 A | 5/1995 | Franck |
| 5,521,561 A | 5/1996 | Yrjola et al. |
| 5,589,796 A | 12/1996 | Alberth, Jr. et al. |
| 6,060,752 A | 5/2000 | Williams |
| 6,271,727 B1 | 8/2001 | Schmukler |
| 6,411,098 B1 | 6/2002 | Laletin |
| 6,696,902 B2 | 2/2004 | Lerke et al. |
| 6,741,483 B1 | 5/2004 | Stanley |
| 6,828,862 B2 | 12/2004 | Barak |
| 6,841,981 B2 | 1/2005 | Smith et al. |
| 6,990,357 B2 | 1/2006 | Ellä et al. |
| 7,003,265 B2 | 2/2006 | Jeon et al. |
| 7,079,816 B2 | 7/2006 | Khorram et al. |
| 7,120,399 B2 | 10/2006 | Khorram |

(Continued)

*Primary Examiner* — Steven J Mottola
(74) *Attorney, Agent, or Firm* — Withrow & Terranova, P.L.L.C.

(57) ABSTRACT

Achievement of robust stability of a power amplifier (PA) that allows the sharing of the ground between the driver stages and the output stage is shown. A controlled amount of negative feedback is used to neutralize the local positive feedback that results from the driver-to-output stage ground sharing in the signal path, for example, a radio frequency (RF) signal path. The solution keeps a strong drive and a good performance of the PA. Exemplary embodiments are shown for the PA positive feedback neutralization. A first embodiment uses a ground signal divider while another embodiment uses a ground signal divider weighting technique.

15 Claims, 8 Drawing Sheets

(56) References Cited

U.S. PATENT DOCUMENTS

| | | |
|---|---|---|
| 7,138,872 B2 | 11/2006 | Blednov |
| 7,155,252 B2 | 12/2006 | Martin et al. |
| 7,180,373 B2 | 2/2007 | Imai et al. |
| 7,187,945 B2 | 3/2007 | Ranta et al. |
| 7,245,887 B2 | 7/2007 | Khorram |
| 7,260,363 B1 | 8/2007 | Snodgrass |
| 7,269,441 B2 | 9/2007 | Ellä et al. |
| 7,292,098 B2 | 11/2007 | Chen et al. |
| 7,315,438 B2 | 1/2008 | Hargrove et al. |
| 7,365,605 B1 | 4/2008 | Hoover |
| 7,420,416 B2 | 9/2008 | Persson et al. |
| 7,420,425 B2 | 9/2008 | Tsai |
| 7,449,946 B1 | 11/2008 | Hoover |
| 7,468,638 B1 | 12/2008 | Tsai et al. |
| 7,605,650 B2 * | 10/2009 | Forbes ............................ 330/109 |
| 7,623,859 B2 | 11/2009 | Karabinis |
| 7,639,084 B2 | 12/2009 | Liao et al. |
| 7,652,464 B2 | 1/2010 | Lang et al. |
| 7,663,444 B2 | 2/2010 | Wang |
| 7,768,350 B2 | 8/2010 | Srinivasan et al. |
| 7,869,773 B2 | 1/2011 | Kuijken |
| 7,890,063 B2 | 2/2011 | Ahn et al. |
| 7,920,833 B2 | 4/2011 | Qiao et al. |
| 7,924,209 B2 | 4/2011 | Kuo et al. |
| 7,948,305 B2 | 5/2011 | Shirokov et al. |
| 7,986,186 B2 | 7/2011 | Marbell et al. |
| 8,027,175 B2 | 9/2011 | Liu et al. |
| 2003/0078011 A1 | 4/2003 | Cheng et al. |
| 2003/0193371 A1 | 10/2003 | Larson et al. |
| 2005/0052296 A1 | 3/2005 | Manlove et al. |
| 2005/0122163 A1 | 6/2005 | Chu |
| 2007/0008236 A1 | 1/2007 | Tillery et al. |
| 2007/0075784 A1 | 4/2007 | Pettersson et al. |
| 2008/0102762 A1 | 5/2008 | Liu et al. |
| 2008/0129642 A1 | 6/2008 | Ahn et al. |
| 2009/0073078 A1 | 3/2009 | Ahn et al. |
| 2009/0195946 A1 | 8/2009 | Kleveland |
| 2009/0296855 A1 | 12/2009 | Kitamura et al. |
| 2010/0063497 A1 | 3/2010 | Orszulak |
| 2010/0105340 A1 | 4/2010 | Weissman |
| 2010/0203922 A1 | 8/2010 | Knecht et al. |
| 2010/0321096 A1 | 12/2010 | Sudjian |
| 2011/0025408 A1 | 2/2011 | Cassia et al. |
| 2011/0074509 A1 | 3/2011 | Samavedam et al. |
| 2011/0143690 A1 | 6/2011 | Jerng et al. |
| 2011/0148521 A1 | 6/2011 | Albers et al. |
| 2011/0199146 A1 | 8/2011 | Bakalski et al. |
| 2011/0242858 A1 | 10/2011 | Strzalkowski |
| 2012/0049925 A1 | 3/2012 | Ha et al. |

\* cited by examiner

GROUND PARTITIONED POWER AMPLIFIER FOR STABLE OPERATION

CROSS-REFERENCE TO RELATED APPLICATIONS

This application claims the benefit of U.S. Provisional Patent Application No. 61/419,858 filed Dec. 5, 2010.

BACKGROUND OF THE INVENTION

1. Field of the Invention

The invention generally relates to power amplifiers (PAs) and more specifically to ground partitioning and routing in high-power stages for the purpose of ensuring stable operation.

2. Prior Art

Achieving stable operation of power amplifiers (PAs) over all design corners is a challenging task. The alternating currents (AC) running through the signal path stages of the PAs is very large. This results in large voltage drops on the parasitic inductor paths. A stable operation is crucially linked to a judicious selection of the signal path power and ground lines partitioning.

FIG. 1 shows a typical PA signal path where the ground connections of each gain stage 110, e.g., stages 110-1, 110-2 and 110-3, and cascode transistors 170, e.g., 170-1 and 170-2 runs through specific parasitic series inductances 120, e.g., inductors 120-1, 120-2, 120-3 and 120-4, to the ground plane (reference potential) via inductance 160. Any voltage drop created by the current in one of the back-end stages that has a feedback path toward the inputs of the front-end stages will result in a global feedback loop closed around signal path stages that have large forward gains. This may therefore lead to PA instability if certain conditions for a positive feedback are met. Specifically these include a total loop gain larger than unity, and a total phase shift around the loop equal to 360° or an integer multiple thereof. To avoid the ground feedback loops the common inductance part 160 of the ground connection needs to be as small as possible so that the different gain stages 110 do not interact through the ground connections.

One solution is to use a Kelvin connection of the grounds in which all the stages have a connection to the ground plane effectively resulting in the common inductance 160 being zero. However, this technique requires a large number of ground pins that in most cases are not economical or even not feasible. Separate output stage ground inductance also results in reduced transistor drive voltages due to the negative feedback created by the ground inductance degeneration of the transistor.

Most of the instability of PAs is linked to the way in which the grounds are routed to the common ground plane. The grounds of different signal path stages are directly interconnected via wires that have a finite parasitic inductance. In contrast, the positive supply usually comes through a bias circuit, e.g. bias circuits 140-1, 140-2, and 140-3, which may be in voltage or current mode, which isolates each stage from the rest of the signal path. Furthermore, each stage usually has a local bypass capacitance 130, e.g., capacitors 130-1, 130-2, and 130-3, that helps even further with the supply isolation. This is the reason for having much less supply instability issues in a PA. Such supply instability may happen if the bias circuitry that isolates each signal path from the other stages gets overloaded.

In most PA architectures it is the ground connection that may lead to instability since the ground pins of the different building blocks of the signal path have very little isolation between them, resulting in parasitic feedback loops. The positive supply voltage connections are generally much less sensitive to couplings and parasitic oscillations due to the large isolation provided by the biasing stages for the signal path amplifiers. Both the voltage regulators and current sources, which are the most popular bias circuits, provide very large power supply rejections ratios (PSRR) at low and moderate frequencies and at least some rejection at high frequencies. Saturation of the bias circuits should be avoided since in this case the isolation disappears and instability may occur.

The prior art solution shown in FIG. 1, attempts to break any positive feedback between the output stage ground connections and the different stage path drivers by using a completely segmented ground connection for the output stage. FIG. 2 shows a prior art configuration wherein the input ground (gnd_in) and output ground (gnd_out) are shared. This saves on pins and increased voltage drive, but comes with instability concerns. This at least avoids the ground related instability.

Therefore, in view of the deficiencies of the prior art, it would be advantageous to provide a partitioning solution for the ground of a PA that overcomes at least these deficiencies and taking into account that a PA needs to be built with a cascade of amplifying stages, each such stage having to have a connection to ground.

DETAILED DESCRIPTION OF THE PREFERRED EMBODIMENTS

Achievement of robust stability of a power amplifier (PA) that allows the sharing of the ground between the driver stages and the output stage is shown. A controlled amount of negative feedback is used to neutralize the local positive feedback that results from the driver-to-output stage ground sharing in the signal path, for example, a radio frequency (RF) signal path. The solution keeps a strong drive and a good performance of the PA. Exemplary embodiments are shown for the PA positive feedback neutralization. A first embodiment uses a ground signal divider while another embodiment uses a ground signal divider weighting technique.

Figure 1:
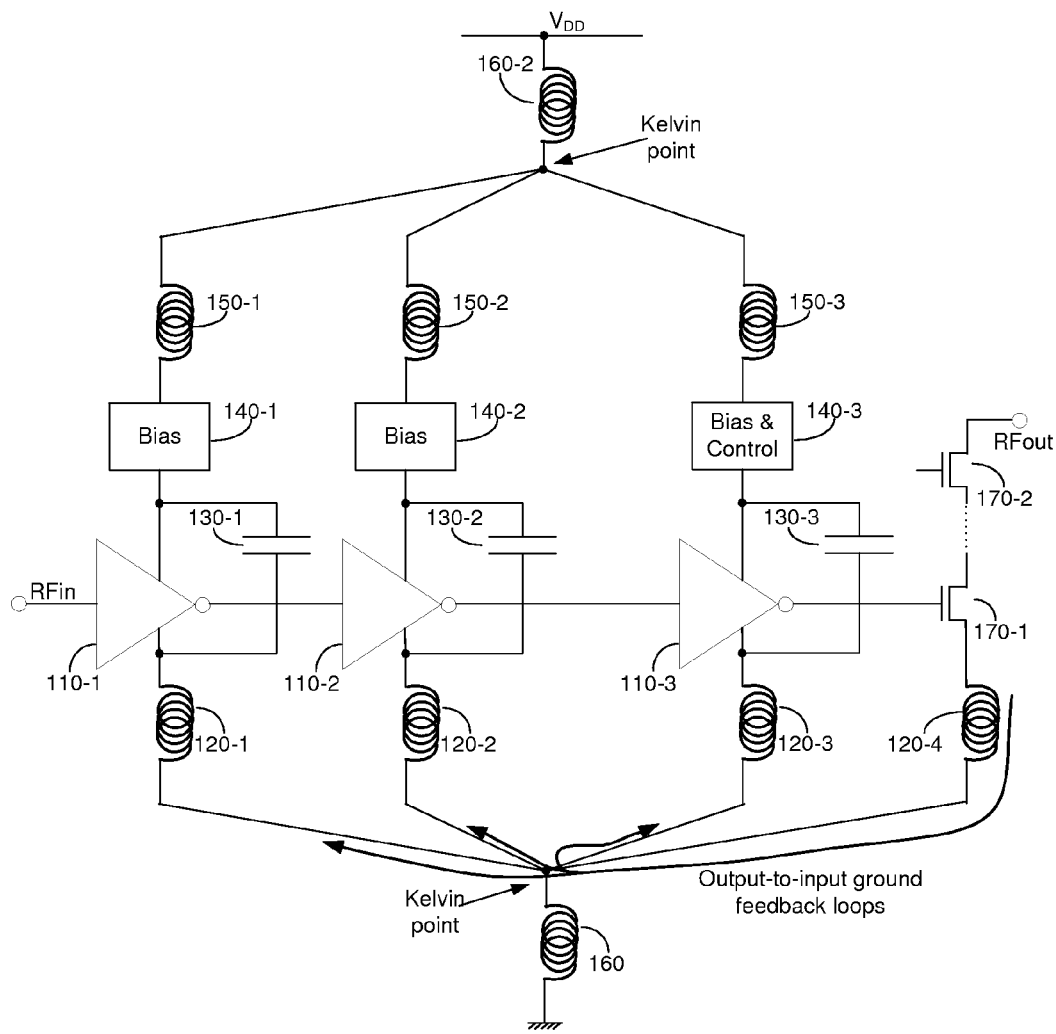
FIG. 1 is a schematic diagram of a parasitic supply and ground feedback loops in a prior art PA.
Figure 2:
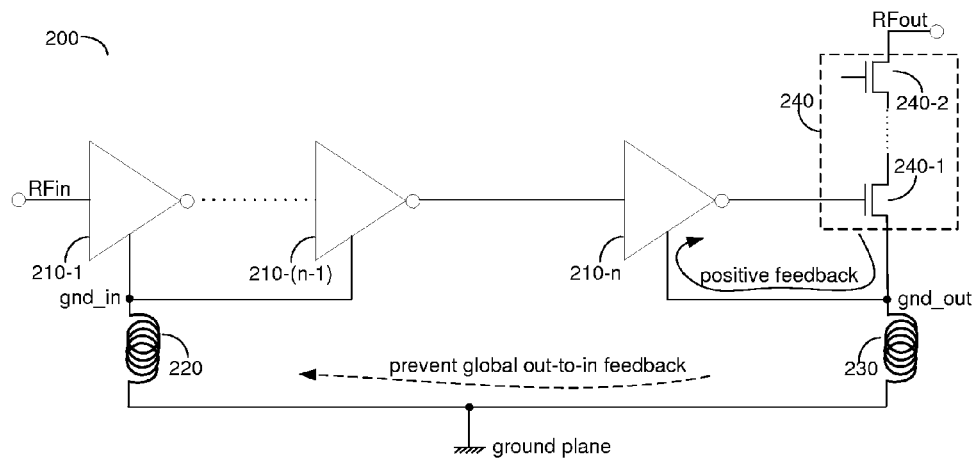
FIG. 2 is a schematic diagram of a prior art PA with shared input and output stage ground connection.

As noted with respect of FIG. 2 in the prior art discussion, the main drawback of such a configuration is the local positive feedback loop that is created between the last gain stage 210-$n$ and the output stage 240 comprising, for example, cascode transistors 240-1 and 240-2. The positive feedback when large signals are applied, may result in PA instability, i.e., loop gain is larger than unity. The primary goal of the invention is to overcome this prior art deficiency and therefore reference is made to FIG. 3 that depicts an exemplary and non-limiting schematic diagram 300 of a PA using a negative feedback to compensate for the last driver stage 310-$n$ to output stage 340 local positive feedback. A signal path comprises a plurality of gain stages 310, for example gain stages 310-1 through 310-$n$. In one embodiment of the invention the signal path is a radio frequency (RF) signal path and hence the input is $RF_{in}$. The solution consists of connecting the ground of the gain stage 310-($n$-1), i.e., the one before last driver in the driver chain of the signal path, to the output ground gnd_out. Now the circuit has a positive feedback loop between driver 310-$n$ and the output stage 340, and a negative feedback loop between driver stage 310-($n$-1), driver stage 310-$n$ and the output stage 340, that is comprised, for example, of cascode transistors 340-1 and 340-2. The negative feedback loop is stronger since it is a much larger loop gain and tends to neutralize the action of the positive loop, thereby avoiding the PA instability due to ground feedbacks.

One drawback of this easy stabilization technique is that the amount of negative feedback applied is set by the gains in the signal path which are determined by the PA RF performance. Usually the negative feedback is much stronger, bringing too large of a penalty on the PA RF performance, e.g., its efficiency. Alternative stabilization techniques are needed to provide both robust PA stability and good RF performance, e.g., high efficiency, high output power, etc. To achieve these goals the local positive feedback needs to be accurately compensated, without over compensation that degrades PA RF performance. The principles of the invention therefore teach the use of a controlled amount of negative feedback to neutralize the local positive feedback loop. Such a technique results in better RF performance when compared with the prior art separated ground and output compensation techniques.

Figure 4:
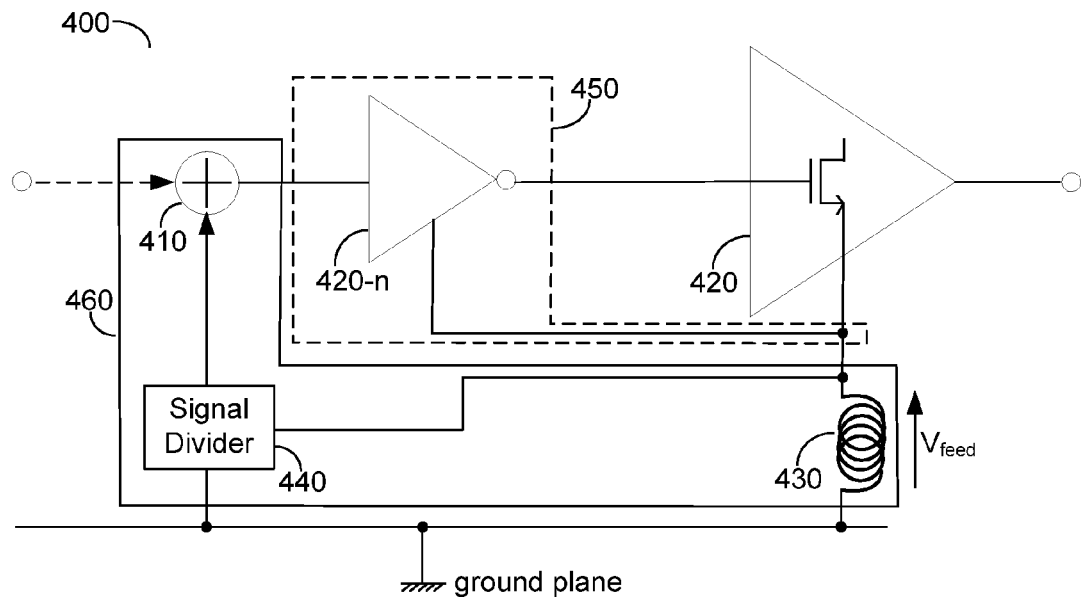
FIG. 4 is a schematic diagram of the principle of positive feedback neutralization using controlled amounts of negative feedback in accordance with the principles of the invention.

Reference is now made to FIG. 4 that depicts an exemplary and non-limiting schematic diagram 400 of the principle of positive feedback neutralization using controlled amounts of negative feedback in accordance with the principles of the invention. The strength of the local positive loop of 450 is set by the value of the output stage ground inductance 430 and the power level (current) of the output stage 420. A dedicated negative feedback block 460 is added to the PA signal path, which senses the feedback voltage Vfeed on inductance 430. A signal divider 440 is used to set the appropriate amount of negative feedback that is just enough to stabilize the PA by summing 410 the input with the feedback signal from the signal divider 440. In some cases the positive feedback may be only partially compensated for. A small amount of positive feedback may be beneficial for providing stronger driving at the lower power consumption.

Figure 9:
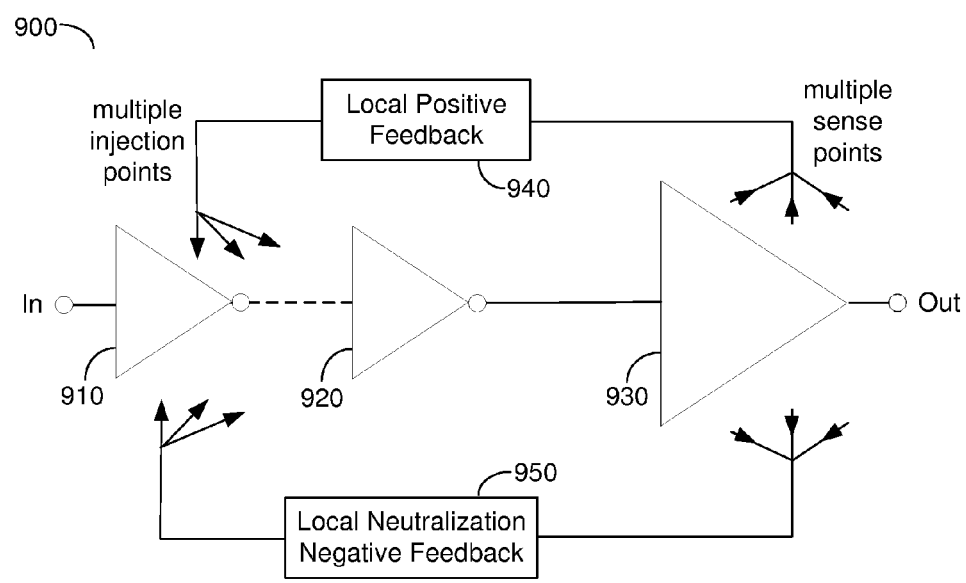
FIG. 9 is a schematic diagram of the local positive feedback and local neutralization using negative feedback in accordance with the principles of the invention.

A more versatile stabilization technique would require a controllable amount of negative feedback to be applied that is just enough to fully or partially neutralize the positive feedback without significantly impacting the PA RF performance. FIG. 9, discussed in greater detail herein below, describes the principles of the inventions with respect of such a controlled amount of neutralizing negative feedback based on a passive implementation, an active implementation or a hybrid of active and passive element implementation. A simple way to achieve a controlled amount of negative feedback via a passive implementation is to use a passive ground signal divider between the output ground node (gnd_out) and the local ground of the one-before-last gain stage of the signal path of the PA. The total amount of negative feedback applied depends on the attenuation of the passive ground signal divider.

Figure 5:
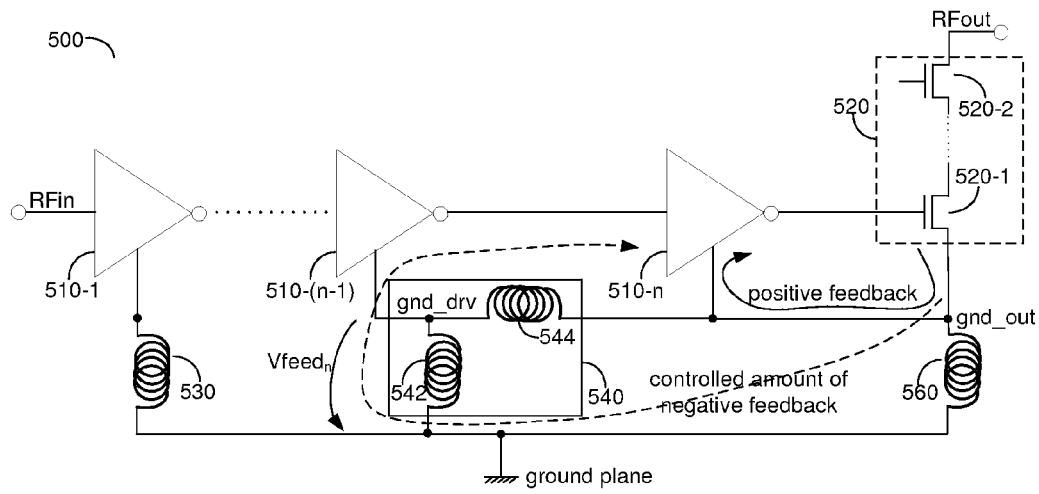
FIG. 5 is a schematic diagram of a controlled amount of negative feedback implemented with an inductor divider to compensate for PA local positive feedback without significantly degrading the PA's performance.

FIG. 5 presents an exemplary and non-limiting schematic diagram 500 of a controlled amount of negative feedback to compensate for PA local positive feedback without significantly degrading the PA's performance. As noted above the simplest way to implement a ground signal divider is to use a passive solution, however, active solutions may also be possible, particularly for high frequency IC processes, and do not depart from the principles of the invention disclosed herein. To achieve stability the strength of the negative feedback from gnd_out, through the ground signal divider 540, the one-before-last gain stage 510-($n$-1), the last gain stage 510-$n$ and gate-to-source 520-1 of the output stage 520 needs to be higher than the strength of the local positive feedback from gain stage 510-$n$ to output stage 520 ground. The ground signal divider 540 controls the gain of the negative feedback through the ratio of the inductor 544 and the inductor 542. Proper selection of the inductance of inductor 544 as a function of inductor 542, typically set by the assembly parasitics, ensures the neutralization of the positive feedback can be achieved without hurting the RF performance.

The advantages of using inductances to address this issue are that they do not need additional area with a proper placement of the gnd_dry pad, they achieve very broadband divider characteristics, and they do not need additional devices since these inductors come intrinsically from the proper layout of the circuit according to the principles of the invention. The single extra element needed to be implemented is an extra ground pin (gnd_drv) for the pre-driver 510-($n$-1). The technique can be used for single-ended, differential or quadrature PA architectures. The ground signal divider may comprise, but is not limited to, an inductive divider, a chain inductive divider, a capacitive divider, a chain capacitive divider, an inductance-capacitance (LC) divider, a chain LC divider, and a hybrid LC series/parallel network.

Figure 6:
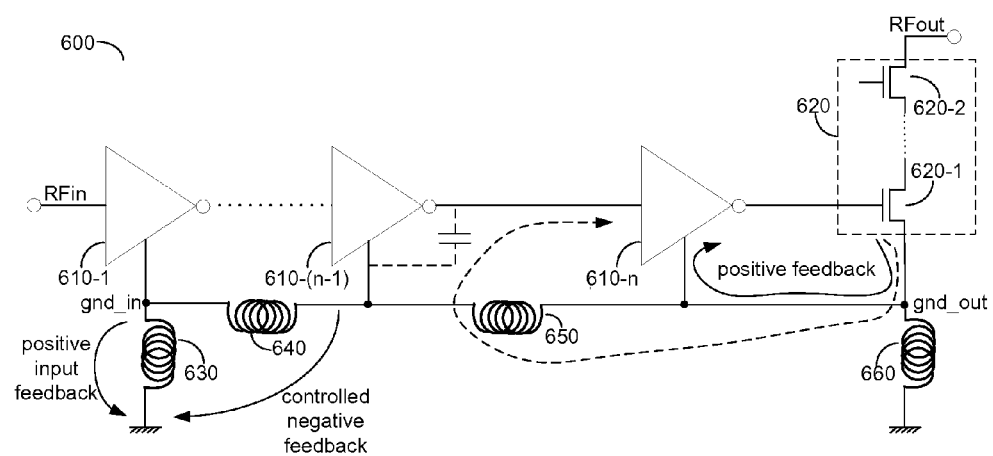
FIG. 6 is a PA with a daisy chain ground connection for achieving controlled negative feedback to compensate for the driver to output stage positive feedback.

In some cases, when the design is pad-limited and it is not possible to get an extra ground pin for the pre-driver, as shown with respect of FIG. 5 to implement the ground signal divider 540, an alternate solution is necessary. Reference is therefore made to FIG. 6 that shows an exemplary and non-limiting PA 600 with a daisy chain ground connection for achieving controlled negative feedback to compensate for the driver to output stage positive feedback in accordance with the principles of the invention. The last driver 610-$n$ and the output stage 620 still share the same ground, gnd_out, to achieve the good driving capability. However, all the other drivers, driver 610-1 through driver 610-($n$-1), share the input ground gnd_in. To avoid local feedbacks between driver 610-1 and driver 610-($n$-1) their ground connections may be Kelvin connected at the gnd_in pad.

The ground inductance divider is built using the input ground, gnd_in. In this case the feedback inductor 640 and the feedback inductor 650 need to be carefully selected such that no significant feedback to the front-end driver 610-1 appears. It is necessary to have the inductance of inductor 640 to be larger than the combined inductance of inductor 650 and inductor 630 to reduce the amount of negative feedback needed to neutralize the positive feedback. Since the inductor 650 needs to be equal to or larger than the inductor 630 to reduce the amount of feedback from gnd_out to gnd_in input ground, such architecture mandates a low inductance for the inductor 630. It should be noted that while an inductor divider was used for the controlled amount of negative feedback other passive network implementations are also possible. It should therefore be noted that the use of different techniques to control the amount of negative feedback for the PA is within the principles of the invention described herein. It should be further noted that a hybrid LC block can be achieved by a proper selection of the different LC products. However, such a hybrid LC network has multiple resonance frequencies (series and parallel) which may impact the PA RF performance if excited.

The ground signal divider stabilization technique discussed herein is very effective in neutralizing the local positive feedback that results from the output stage and the last driver ground sharing. Nonetheless, it requires an additional ground pin. In most cases this is not an issue since a minimal pad size may be good enough. Furthermore, the ground inductor divider comes almost at no added cost since it uses the parasitic inductances of the ground connections that have a given amount of metal wire, but requiring particular design considerations.

Figure 7A:
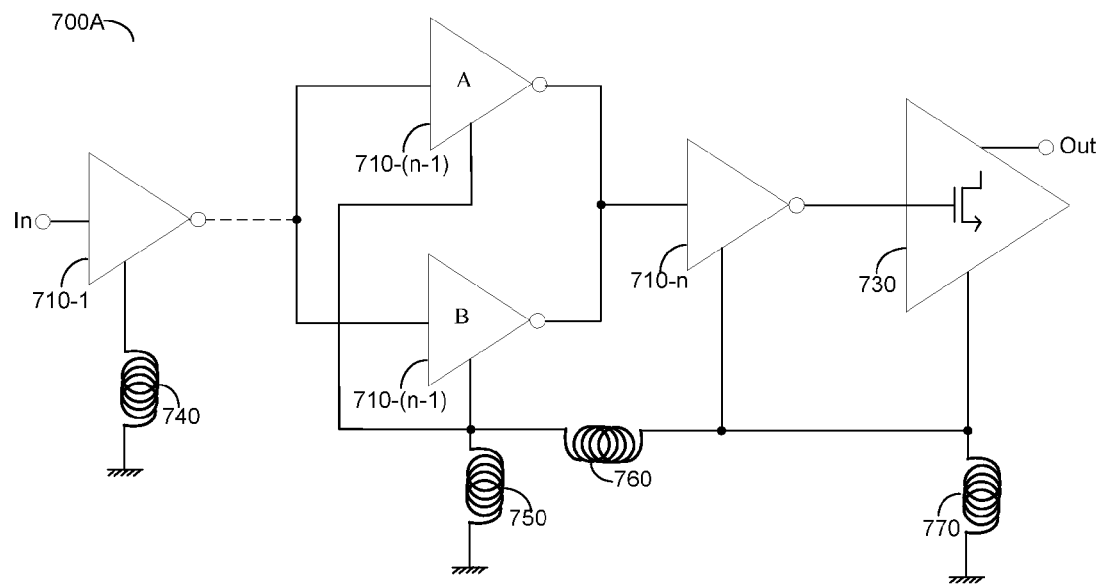
FIG. 7A is a first alternative for passive positive feedback neutralization using a ground signal divider technique.
Figure 7B:
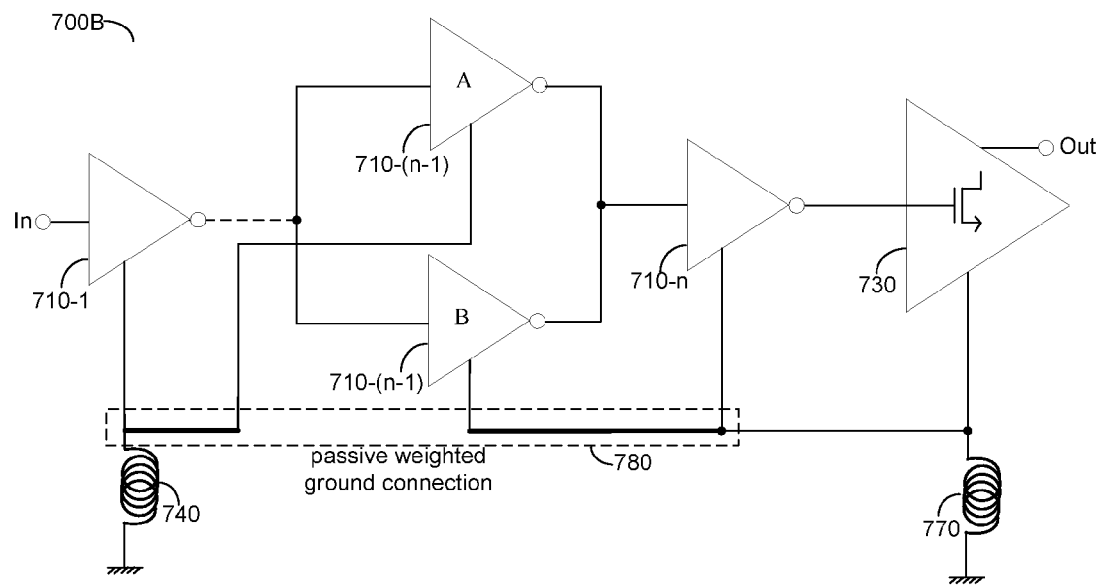
FIG. 7B is a second alternative for passive positive feedback neutralization using a passive ground weighting technique.

The two goals of cancelling, fully or partially, the local positive feedback and not needing an extra ground pin can be simultaneously achieved by using an alternative type of ground signal divider; specifically, a ground weighting technique. Reference is now made to FIG. 7A that depicts the same technique shown in FIG. 5 except that in this case the pre-driver 710-($n$-1) is split into two stages "A" and "B" and connected in parallel. Therefore, the circuit is essentially the same as the one having a single driver at that one-before-last driver stage. The exemplary and non-limiting FIG. 7B shows an alternative for passive positive feedback neutralization using a passive ground weighting technique. The pre-drive 710-($n$-1)-A has its ground connected to the input ground node, while the pre-driver 710-($n$-1)-B has its ground connected to the output ground node. Therefore, only the pre-driver 710-($n$-1)-B is in the negative feedback loop while the pre-driver 710-($n$-1)-A is not. The total size of the pre-driver is equal to A+B, and the strength of the negative feedback is given only by the B weighting factor. The main advantage of this stabilization technique is that it does not need an additional ground pin for the two pre-drivers.

The ground signal divider and the ground weighting methods are two preferred embodiments of the controlled amount of negative feedback. Both use the existing ground wires of the signal path amplifiers to achieve the local positive feedback neutralization. Therefore, they come at virtually no added cost, except for the extra pin need in the ground signal divider method. The necessary inductors are implemented as wire path connections 780 and are carefully designed to suit the task. Both provide stable PA operation over a wide load impedance range and do not need large area additional components, nor do they impact the RF performance in a significant way, as is the case of the output compensation technique which usually degrades the efficiency.

An alternative ground weighting technique is achieved by using the split stage and separate ground configuration at the last driver. In this way the amount of local positive feedback is controlled to avoid instability. Only the last driver 710-($n$)-B (not shown) has a local positive feedback, while the other driver, 710-($n$)-A (not shown) does not. The weighting of the output stage can be adjusted to a certain point that avoids instability. The main drawbacks of this configuration is that the driver 710-$n$-A has a large degradation factor due to the RF signal difference between the input and output grounds. This reduces the strength of the combined last driver 710-$n$ and requires a larger power dissipation in this stage, degrading the overall PA performance. Therefore, it is more efficient to apply a weighting technique for the ground signal divider to the pre-divider 710-($n$-1) stage as shown in FIGS. 7A and 7B. There are several ways of applying the weighted ground signal divider technique to the pre-driver, which involves the combining of the RF signal at different points in the signal path. At the summation node there will always be two drivers fighting each other. Therefore there will be some power loss due to the current cancellation through summation. Since the summation is done at the lower power nodes the power penalty, i.e., the efficiency degradation, is much lower when compared with the cases where summation is done in a later stage. It should be noted that various summations techniques may therefore take place which include but may not be limited to summation at the pre-driver output, summation at the last driver output, summation at the output stage of a cascode device source, summation at the PA output after the output stage. It should be further understood that voltage mode signal summation, current mode signal summation, or a hybrid of voltage and current signal summation may take place and all are within the scope of the invention.

Figure 8A:
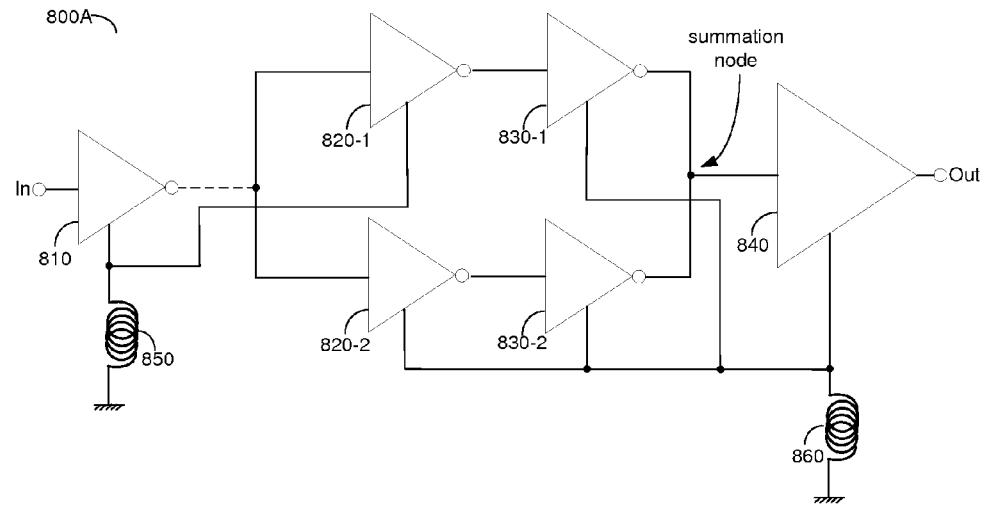
FIG. 8A is a schematic diagram of a first solution for signal summation placement at the last driver output.

FIG. 8A depicts an exemplary and non-limiting schematic diagram 800A of a first solution for signal summation placement at the last driver output. It shows an active controlled negative feedback implementation in which both the pre-driver 820 and the last driver 830 are split into drivers 820-1 and 820-2 and drivers 830-1 and 830-2 respectively. The main drawback of such a solution is that the summation is performed in current mode at the node connecting the outputs of drivers 830-1 and 830-2, where the signal power is large. At this summation point the fighting between the currents of the two driver stages may result in much larger power and efficiency losses.

Figure 8B:
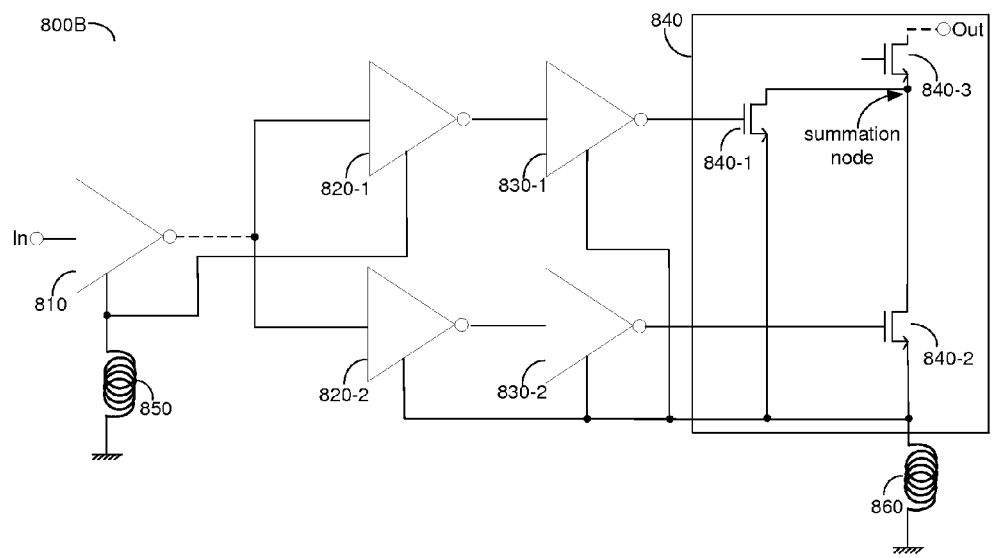
FIG. 8B is a schematic diagram of a second solution for signal summation placement at the output stage cascode.

FIG. 8B shows an exemplary and non-limiting schematic diagram 800B of a second solution for signal summation placement at the output stage cascode node 840. This is an alternative split active path implementation where the pre-driver 820, the driver 830 and the output stage 840 are split. The summation is performed at a low impedance node of the output stage, i.e., the cascode node.

Figure 8C:
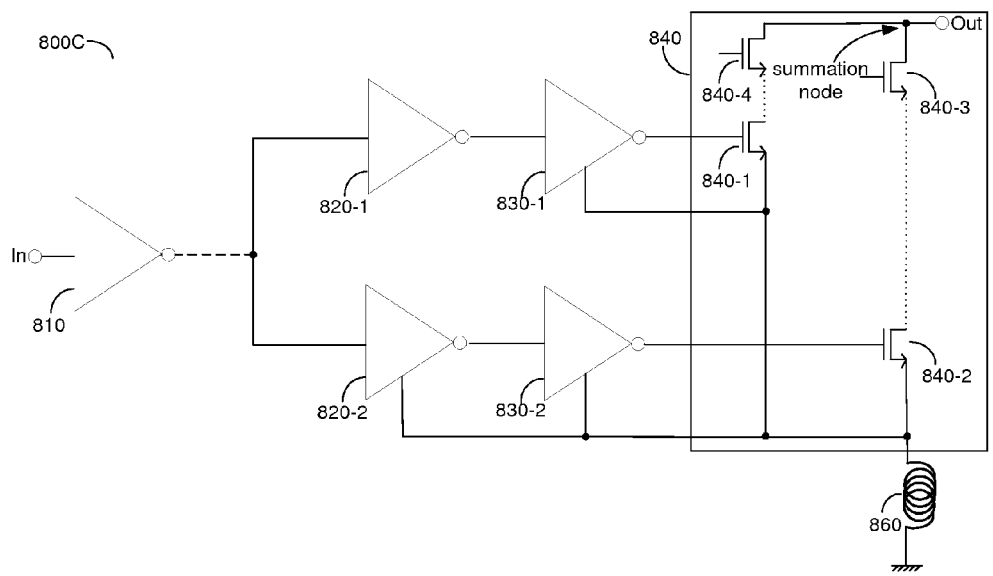
FIG. 8C is a schematic diagram of a third solution for signal summation placement at the PA output.

FIG. 8C depicts an exemplary and non-limiting schematic diagram 800C of a third solution for signal summation placement at the PA output. This is another alternative split active path implementation of the controlled negative feedback in which the summation is done directly at the output of the PA. This may result in an easier layout implementation, however, the impedance of the output of the PA is in most cases larger than the one of cascode source node.

The effectiveness of all the exemplary and non-limiting embodiments shown with respect of FIGS. 8A, 8B and 8C, having an active split path configuration, depends on the layout technique used, distributed or concentrated, the physical distances between different stages and their power levels. Certainly, the active and passive techniques of providing a controlled amount of negative feedback to neutralize the positive feedback can be combined in a mixed solution. The scope of this invention therefore covers any other types of passive, active or hybrid implementations that are based on providing a controlled amount of negative feedback to control the positive feedback with the aim of achieving a stable PA operation.

Figure 3:
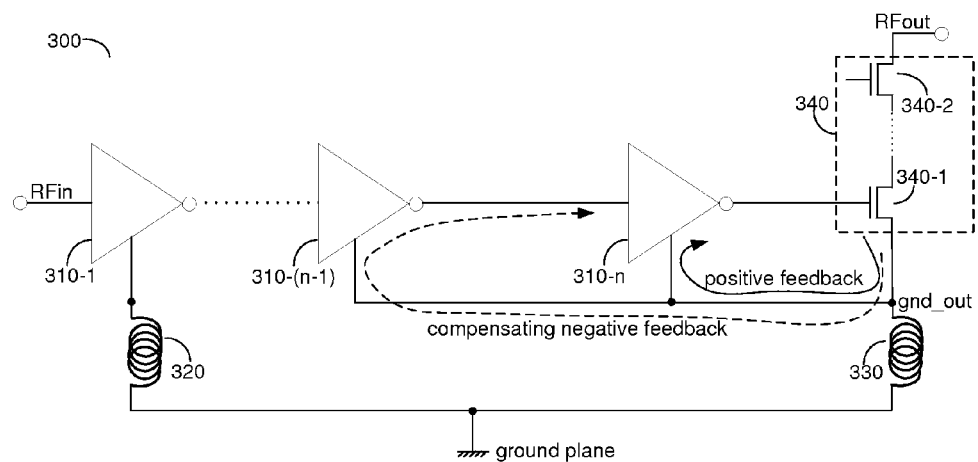
FIG. 3 is a schematic diagram of a PA using a negative feedback to compensate for the last driver stage to output stage local positive feedback.

It should be noted the inductors 330 in FIG. 3, 560 of FIG. 5, 660 of FIG. 6, 770 of FIGS. 7A and 7B, and 860 of FIGS. 8A, 8B and 8C, and the power level (current) of their respective output stages determine the strength of the local positive loop, as described with respect of FIG. 4. It should be further noted that the inductors 320 in FIG. 3, 530 in FIG. 5, 740 in FIGS. 7A, 7B and 7C, and 850 in FIGS. 8A, 8B and 8C, are used to reduce the amount of negative feedback needed to neutralize the positive feedback, as also discussed with respect of inductor 630 of FIG. 6.

Reference is now made to FIG. 9 that depicts a schematic diagram 900 of the local positive feedback 940 and local neutralization 950 using negative feedback in accordance with the principles of the invention. The local positive feedback loop 940 created by the ground sharing between the last drive 920 and the output stage 930 is merely one example of instability caused in PA systems. There are many other ways in which a local positive feedback loops may be created in the PA signal path. Hence the local positive feedback 940 may sense at one or more sense points and deliver a positive feedback into one or more injection points. To neutralize the effects of one or more of the local positive feedbacks, the local neutralization negative feedback 950 senses in one or more sense points and provides negative feedback to one or more injection points, all in accordance with the principles of the invention. Hence, FIG. 9 provides an understanding for the general principle of operation of the stabilizing techniques in accordance with the invention. It should be further understood that a plurality of positive feedback loops may be fully or partially neutralized by a global controlled negative feedback loop, and in fact any possible combination is envisioned. It should be further understood that the negative and positive feedback loops can be inductive, capacitive, mixed or of any other passive or active combination or nature without departing from the scope of the invention.

Figure 10:
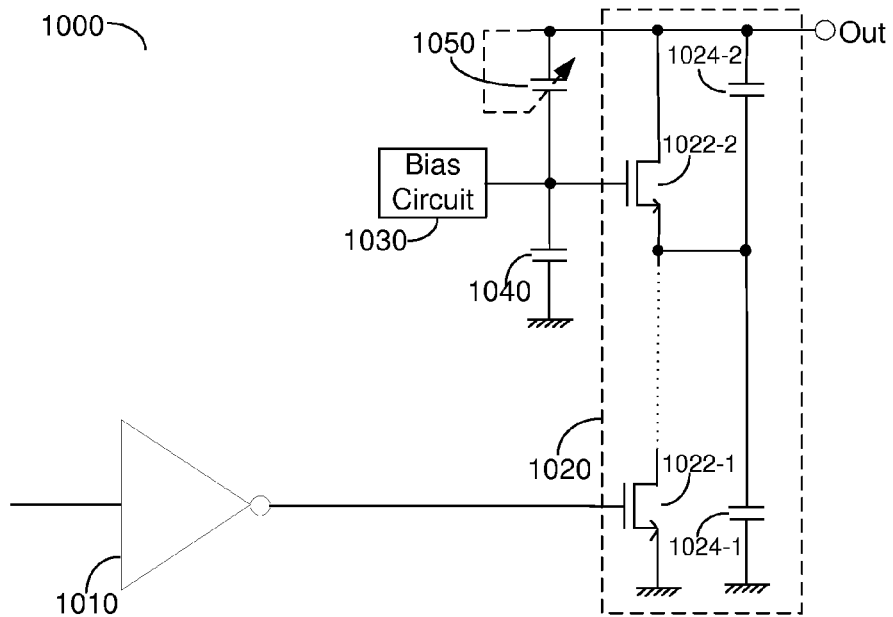
FIG. 10 is a schematic diagram of a PA having the local positive feedback in the cascode device of the output stage.

The sharing of the ground between the last driver and the output stage is merely one way in which a positive feedback may appear in the PA signal path. FIG. 10 is an exemplary and non-limiting schematic diagram 1000 of a PA having the local positive feedback in the cascode device of the output stage. This is an often encountered local positive feedback loop in the PA signal path and is created by the last cascode device 1022-2 of the output stage 1020. The capacitance 1024-2 represents any intentional capacitance as well as any unintentional parasitic capacitance between the drain and the source of the cascode device 1022-2. The capacitance 1024-1 represents any intentional capacitance and any unintended parasitic capacitance between the source of the cascode device 1022-2 and the ground node. The resulting capacitance divider between 1024-2 and 1024-1 results in a positive feedback loop around the cascode device 1022-2 which often results in PA instability. The stabilization technique involves by bypassing the gate of the cascode device 1022-2 by means of capacitance 1040. An additional capacitor 1050 can be added between the drain and gate of the cascode device 1022-2. The capacitance creates a negative feedback loop which compensates, either partially or fully, the positive feedback due to the capacitive divider. In one embodiment of the invention the capacitance 1050 is voltage dependent (e.g. varacter) in order to minimize it's loading at the PA output and thus reduce the penalty on the RF PA performance. Hence is should be understood that such drain-to-gate feedback may comprise but is not limited to, a constant drain-to-gate capacitance, an output voltage dependent drain-to-gate capacitance, and a load impedance dependent drain-to-gate capacitance.

Figure 11:
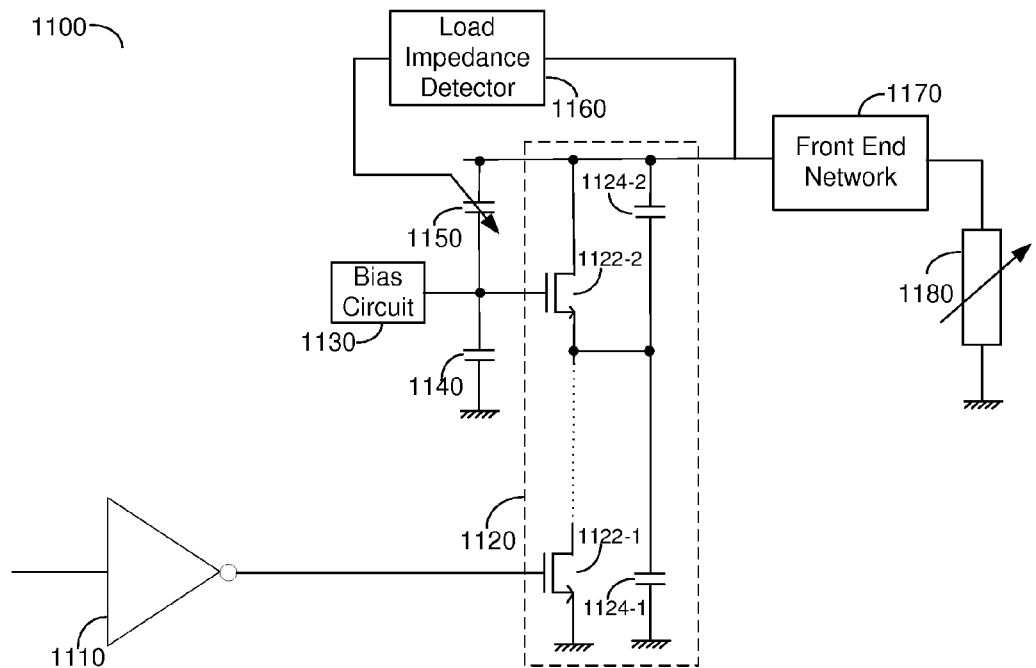
FIG. 11 is a PA using load impedance dependent neutralizing negative feedback.

In one embodiment of the invention the capacitance 1050 may be controlled by an optional load impedance value detector, e.g., a voltage standing-wave ratio (VSWR) detector, such that the amount of neutralizing negative feedback applied is dependent on the load impedance. Such a configuration is shown in the exemplary and non-limiting FIG. 11. This configuration can optimize PA performance over a wide load impedance range and minimize the PA performance degradation in the nominal load impedance condition. In FIG. 11 both the positive and the negative local feedbacks are created by capacitors 1150 and 1140, however, this should not be viewed as limiting the generality of the invention. The neutralization network may be implemented as both a passive or active network, using inductive, capacitive or even hybrid networks.

While the disclosed invention is described hereinabove with respect to specific exemplary embodiments, it is noted that other implementations are possible that provide the advantages described hereinabove, and which do not depart from the spirit of the inventions disclosed herein. Such embodiments are specifically included as part of this invention disclosure which should be limited only by the scope of its claims. Furthermore, the apparatus disclosed in the invention may be implemented as a semiconductor device on a monolithic semiconductor.

What is claimed is:

1. A power amplifier system comprising:
a signal path comprising a plurality of cascaded gain stages and an output stage the input of which is coupled to the output of the last gain stage of the plurality of cascaded gain stages, wherein at least one local positive feedback loop is created in the signal path by one or more shared ground connections between one or more of the plurality of cascaded gain stages and the output stage; and
a neutralizing feedback loop configured to control at least one negative feedback loop to balance the at least one local positive feedback loop.

2. The power amplifier system of claim 1, wherein the signal path is a radio frequency signal path.

3. The power amplifier system of claim 1, wherein the neutralizing feedback loop balances the at least one local positive feedback loop either partially or fully.

4. The power amplifier system of claim 1, wherein the neutralizing feedback loop comprises at least one of: a passive element network, an active element network, and a hybrid of active and passive element networks.

5. The power amplifier system of claim 1, wherein the neutralizing feedback loop comprises a ground signal divider.

6. The power amplifier system of claim 5, wherein the ground signal divider is at least one of: an inductive divider, chain inductive divider, capacitive divider, chain capacitive divider, inductance-capacitance divider, chain inductance-capacitance divider, hybrid inductance-capacitance series/parallel network.

7. The power amplifier system of claim 5, wherein the ground signal divider is a weighted ground signal divider.

8. The power amplifier system of claim 7, wherein the weighted ground signal divider comprises at least one of: a split pre-driver stage and a weighted ground signal divider thereto, a split last driver stage and a weighted ground signal divider thereto.

9. The power amplifier system of claim 7, wherein summation of a ground signal from the ground signal divider comprises one of: summation at the pre-driver output, summation at the last driver output, summation at the output stage of a cascode device source, summation at the power amplifier output after the output stage.

10. The power amplifier system of claim 9, wherein summation comprises:
voltage mode signal summation, current mode signal summation, hybrid voltage and current signal summation.

11. A power amplifier system comprising:
a signal path having at least one local positive feedback loop present in the signal path, wherein the local positive feedback loop is created by one or more shared ground connections in the signal path; and
a neutralizing feedback loop configured to control at least one negative feedback loop to balance the at least one local positive feedback loop.

12. The power amplifier system of claim 11, wherein the signal path is a radio frequency signal path.

13. A power amplifier system comprising:
a signal path comprising a plurality of cascaded gain stages and an output stage the input of which is coupled to the output of the last gain stage of the plurality of cascaded gain stages, wherein at least one local positive feedback loop is created in the signal path by one or more cascode devices in the output stage; and
a neutralizing feedback loop configured to control at least one negative feedback loop to balance the at least one local positive feedback loop.

14. The power amplifier system of claim 13, wherein the at least one local positive feedback loop is created due to a parasitic capacitance associated with one or more of the cascode devices in the output stage.

15. The power amplifier system of claim 13, wherein the neutralizing feedback loop comprises at least one of: a constant drain-to-gate capacitance coupled to one or more of the cascode devices in the output stage, an output voltage dependent drain-to-gate capacitance coupled to one or more of the cascode devices in the output stage, a load impedance dependent drain-to-gate capacitance coupled to one or more of the cascode devices in the output stage.

* * * * *